(12) United States Patent
Svalange

(10) Patent No.: US 6,337,585 B1
(45) Date of Patent: Jan. 8, 2002

(54) TRANSCONDUCTOR

(75) Inventor: Pär Svalange, Stockholm (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 09/693,984

(22) Filed: Oct. 23, 2000

(30) Foreign Application Priority Data

Nov. 2, 1999 (SE) .............................................. 9903921

(51) Int. Cl.$^7$ ........................ H02M 11/00; H03D 11/00
(52) U.S. Cl. ........................ 327/103; 327/102; 327/563
(58) Field of Search ............................. 327/52, 65, 68, 327/70, 355, 359, 103, 561, 563, 102; 330/252, 260; 455/333

(56) References Cited

U.S. PATENT DOCUMENTS

| | | | | |
|---|---|---|---|---|
| 4,461,042 A | * | 7/1984 | Tanabe et al. | 455/333 |
| 4,934,770 A | | 6/1990 | Anderson et al. | 330/278 |
| 5,079,454 A | * | 1/1992 | Benton et al. | 327/65 |
| 5,166,645 A | * | 11/1992 | Watts | 455/333 |
| 5,233,311 A | * | 8/1993 | Chevallier | 330/260 |
| 5,434,544 A | * | 7/1995 | Van Veenendaal | 331/117 R |
| 5,596,299 A | * | 1/1997 | Persico et al. | 327/260 |
| 5,652,543 A | * | 7/1997 | Fenk et al. | 327/252 |
| 5,859,558 A | * | 1/1999 | Chen et al. | 327/355 |
| 6,188,282 B1 | * | 2/2001 | Montalvo | 330/260 |

FOREIGN PATENT DOCUMENTS

| | | | |
|---|---|---|---|
| EP | 0915561 A1 | | 5/1999 |
| JP | 10-126300 | * | 5/1998 |

* cited by examiner

*Primary Examiner*—Terry D. Cunningham
*Assistant Examiner*—Long Nguyen
(74) *Attorney, Agent, or Firm*—Nixon & Vanderhye P.C.

(57) ABSTRACT

To control the transconductance of a transconductor, its voltage input terminal (Vin2) is connected to the base of a first and a second transistor (Q21, Q22) via respective capacitors (C21, C22). The interconnection points between the capacitors (C21, C22) and the respective base are connected to the respective control voltage terminal (Vreg2+, Vreg2−) of the transconductor via a first and a second resistor (R21, R22), respectively. The emitters of said first and second transistors (Q21, Q22) are interconnected, and the interconnection point is connected to a ground terminal via a third resistor (R23). The collector of the first transistor (Q21) is connected to the current output terminal (Iout2) of the transconductor, and the collector of the second transistor (Q22) is connected to the supply voltage terminal (Vcc2) of the transconductor.

1 Claim, 1 Drawing Sheet

TRANSCONDUCTOR

TECHNICAL FIELD

The invention relates to a transconductor.

BACKGROUND OF THE INVENTION

FIG. 1 illustrates a known transconductor comprising a voltage input terminal Vin1, a current output terminal Iout1, a supply voltage terminal Vcc1, and two control voltage terminals Vreg1+ and Vreg1−. A control voltage is to be applied between the control voltage terminals Vreg1= and Vreg1− to control the transconductance of the transconductor.

The voltage input terminal Vin1 is connected to the base of a transistor Q11, whose emitter is connected to a ground terminal via a resistor R11 and whose collector is connected to an interconnection point between emitters of two transistors Q12 and Q13. The base of the transistor Q12 is connected to the control voltage terminal Vreg1+, while the base of the transistor Q13 is connected to the control voltage terminal Vreg1−. The collector of the transistor Q12 is connected to the current output terminal Iout1, while the collector of the transistor Q13 is connected to the supply voltage terminal Vcc1.

By varying the voltage between the control voltage terminals Vreg1+ and Vreg1−, the output current on the current output terminal Iout1 will vary correspondingly.

The known transconductor shown in FIG. 1 cannot be used at low supply voltages applied between the supply voltage terminal Vcc1 and ground since it requires quite a large voltage range due to the fact that the transistors Q11, Q12 and Q13 are stacked on each other.

SUMMARY OF THE INVENTION

The object of the invention is to bring about a transconductor that enables power control also at low supply voltages.

This is attained in the transconductor according to the invention in that it comprises only two transistors without stacking.

Hereby, operation at a lower supply voltage is enabled.

BRIEF DESCRIPTION OF THE DRAWING

The invention will be described more in detail below with reference to the appended drawing on which FIG. 1, as described above, shows a known transconductor.

DESCRIPTION OF THE INVENTION

Figure 1:
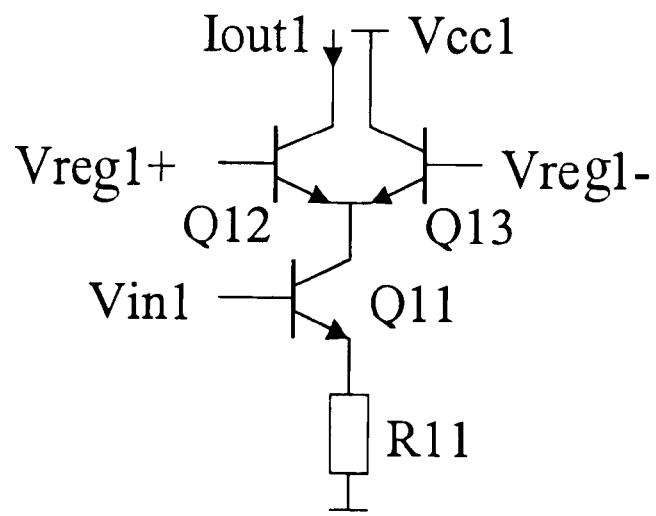
Figure 2:
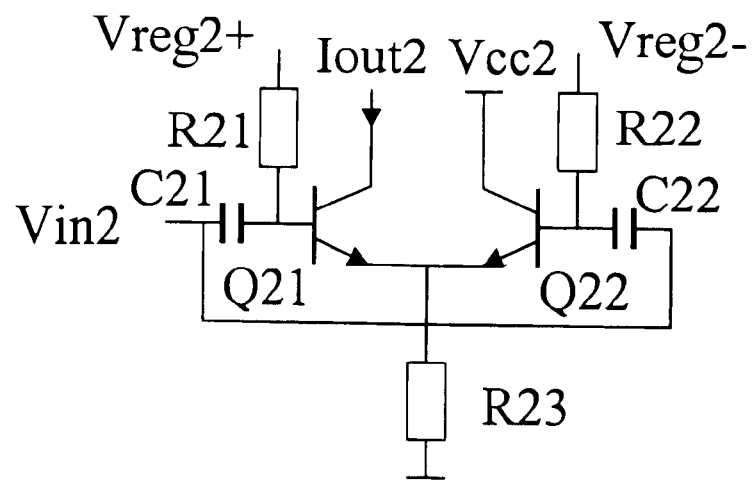
FIG. 2 shows an embodiment of a transconductor in accordance with the invention.

As the known transconductor in FIG. 1, the transconductor according to the invention, illustrated in FIG. 2, comprises a voltage input terminal Vin2, a current output terminal Iout2, a supply voltage terminal Vcc2, and two control voltage terminals Vreg2+ and Vreg2−, between which a control voltage is to be applied to control the transconductance of the transconductor in FIG. 2.

In accordance with the invention, the voltage input terminal Vin2 is connected to the base of two transistors Q21 and Q22 via respective capacitors C21 and C22.

Also in accordance with the invention, the interconnection points between the capacitors C21, C22 and the respective base of the transistors Q21, Q22, are connected to the respective control voltage terminal Vreg2+, Vreg2−via resistors R21 and R22, respectively.

The emitters of the transistors Q21, Q22 are interconnected, and the interconnection point between the emitters is connected to a ground terminal via a resistor R23.

In the embodiment of the transconductor according to the invention shown in FIG. 2, the collector of the transistor Q21 is connected to the current output terminal Iout2, while the collector of the transistor Q22 is connected to the supply voltage terminal Vcc2.

In that the transconductor according to the invention comprises only two transistors instead of three as in the known transconductor according to FIG. 1, the transconductor according to the invention can be used at lower supply voltages than the known transconductor.

Moreover, the linearity will be higher in comparison with the known transconductor.

What is claimed is:

1. A transconductor comprising:
   a voltage input terminal;
   a current output terminal connected to a collector of a first transistor;
   a supply voltage terminal connected to a collector of a second transistor;
   first and second control voltage terminals, having first and second control voltages, respectively, wherein the first control voltage terminal is connected to a base of the first transistor via a first resistor and the second control voltage terminal is connected to a base of the second transistor via a second resistor so that the first and second control voltages applied to the first and second control voltage terminals terminals, respectively, causes transconductance of the transconductor to vary;
   wherein the voltage input terminal is connected to the respective bases of the first and second transistors via first and second capacitors, respectively;
   wherein the emitters of the respective first and second transistors are interconnected and are connected to ground via a common third resistor; and
   wherein the transconductor includes only two transistors, namely the first and second transistors.

* * * * *